(12) United States Patent
Gee et al.

(10) Patent No.: US 8,209,644 B2
(45) Date of Patent: *Jun. 26, 2012

(54) HIERARCHICAL PARTITIONING

(75) Inventors: Perry Gee, San Jose, CA (US); Syed Zakir Hussain, Hillsborough, CA (US)

(73) Assignee: Infinisim, Inc., Belmont, CA (US)

( * ) Notice: Subject to any disclaimer, the term of this patent is extended or adjusted under 35 U.S.C. 154(b) by 155 days.

This patent is subject to a terminal disclaimer.

(21) Appl. No.: 12/471,344

(22) Filed: May 22, 2009

(65) Prior Publication Data

US 2009/0300556 A1 Dec. 3, 2009

Related U.S. Application Data

(63) Continuation of application No. 11/532,898, filed on Sep. 18, 2006, now Pat. No. 7,555,733.

(60) Provisional application No. 60/718,487, filed on Sep. 18, 2005.

(51) Int. Cl.
*G06F 17/50* (2006.01)
*G06F 9/455* (2006.01)

(52) U.S. Cl. ......... 716/100; 716/111; 716/118; 716/125

(58) Field of Classification Search .................. 716/100, 716/111, 118, 125
See application file for complete search history.

(56) References Cited

U.S. PATENT DOCUMENTS

| | | | |
|---|---|---|---|
| 5,671,399 A * | 9/1997 | Meier ........................... 716/106 |
| 6,038,381 A | 3/2000 | Münch et al. |
| 6,086,626 A | 7/2000 | Jain et al. |
| 6,577,992 B1 | 6/2003 | Tcherniaev et al. |
| 6,816,826 B1 | 11/2004 | Andersen et al. |
| 7,013,253 B1 | 3/2006 | Cong et al. |
| 7,047,510 B1 | 5/2006 | Chopra et al. |
| 7,181,708 B1 | 2/2007 | Du et al. |
| 7,493,578 B1 * | 2/2009 | Milne et al. ................... 716/106 |
| 7,555,733 B1 | 6/2009 | Gee et al. |
| 2002/0133325 A1 | 9/2002 | Hoare, II et al. |
| 2002/0183990 A1 | 12/2002 | Wasynczuk et al. |
| 2003/0163297 A1 | 8/2003 | Khaira et al. |
| 2004/0093571 A1 | 5/2004 | Jain et al. |
| 2005/0081173 A1 | 4/2005 | Peyran |

(Continued)

OTHER PUBLICATIONS

U.S. Appl. No. 12/264,246, filed Nov. 3, 2008, Hussain, Syed Zakir.

(Continued)

*Primary Examiner* — Stacy Whitmore
*Assistant Examiner* — Magid Dimyan
(74) *Attorney, Agent, or Firm* — Adeli & Tollen LLP

(57) ABSTRACT

Some embodiments provide a method of simulating an electrical circuit that receives a circuit description that has a set of sub-circuits. The method defines several partitions for several sub-circuits. The method then simulates the circuit using the partitioned sub-circuits. In some embodiments, the method ranks the sub-circuits prior to partitioning based on a parent-child relationship that shows how a sub-circuit is instantiated by other sub-circuits. These embodiments partition child sub-circuits first. Some embodiments provide a method of partitioning an electrical circuit that has a set of sub-circuits. For a particular sub-circuit that is instantiated from other sub-circuits, the method duplicates the particular sub-circuit into a first copy and a second copy when one port of the particular sub-circuit is connected to a voltage source in at least one instance and the same port is not connected to a voltage source in at least another instance.

23 Claims, 16 Drawing Sheets

U.S. PATENT DOCUMENTS

| | | |
|---|---|---|
| 2006/0129953 A1 | 6/2006 | Jain |
| 2007/0044051 A1 | 2/2007 | McGaughy et al. |
| 2008/0004854 A1 | 1/2008 | Hemmett |
| 2009/0300566 A1 | 12/2009 | Gee et al. |

OTHER PUBLICATIONS

U.S. Appl. No. 12/264,247, filed Nov. 3, 2008, Hussain, Syed Zakir.

Portions of prosecution history of U.S. Appl. No. 11/532,898, May 18, 2009, Gee, Perry, et al.

Portions of persecution history of U.S. Appl. No. 12/471,343, Oct. 7, 2009, Gee, Perry, et al.

Portions of persecution history of U.S. Appl. No. 12/264,246, Apr. 21, 2009, Hussain, Syed Zakir.

Portions of persecution history of U.S. Appl. No. 12/264,247, Apr. 21, 2009, Hussain, Syed Zakir.

Rao, Vasant B., et al., Switch Level Timing Simulation of MOS VLSI Circuits, 1989 (Month N/A), pp. 30-47, 70-91, Kluwer Academic Publishers, Boston, MA, US.

Rao, Vasant B., et al., "Network Partitioning and Ordering for MOS VLSI Circuits", IEEE Transactions on Computer-Aided Design, Jan. 1987, pp. 128-144, vol. CAD-6, No. 1, IEEE, NJ, US.

Tarjan, R., Depth-First Search and Linear Graph Algorithms, SIAM Journal of Computing, Jun. 1972, pp. 146-160, vol. 1, No. 2, Society for Industrial and Applied Mathematics, Philadelphia, PA, US.

Hussain, S.Z., "Adaptive Design Verification of Digital VLSI Systems", Department of Electrical Engineering, Graduate School of Duke University, 1995, Month Unknown, chapter 3, pp. 25-60, Durham, North Carolina.

Updated portions of prosecution history of U.S. Appl. No. 11/532,898, May 22, 2009, Gee, Perry, et al.

Updated portions of prosecution history of U.S. Appl. No. 12/471,343, Aug. 3, 2011, Gee, Perry, et al.

Updated portions of prosecution history of U.S. Appl. No. 12/264,246, Nov. 3, 2011, Hussain, Syed Zakir.

Updated portions of prosecution history of U.S. Appl. No. 12/264,247, Oct. 18, 2011, Hussain, Syed Zakir.

Amelifard, Behnam, et al., "Low-Power Fanout Optimization Using Multiple Threshold Voltage Inverters," International Symposium on Low Power Electronics and Design, Aug. 8-10, 2005, ACM.

Davis, Albert Tatum, "Implicit Mixed-Mode Simulation of VLSI Circuits," Month Unknown, 1991, pp. 108-112 and 120, Department of Electrical Engineering, College of Engineering and Applied Science, University of Rochester, Rochester, New York.

Martin, Dale E., et al., "Integrating Multiple Parallel Simulation Engines for Mixed-Technology Parallel Simulation," Proceedings of the 35th Annual Simulation Symposium, Month Unknown, 2002, IEEE.

Steer, Michael B., "SPICE: User's Guide and Reference," Jul. 2, 2007, pp. 55-57, Edition 1.3, Michael B. Steer.

* cited by examiner

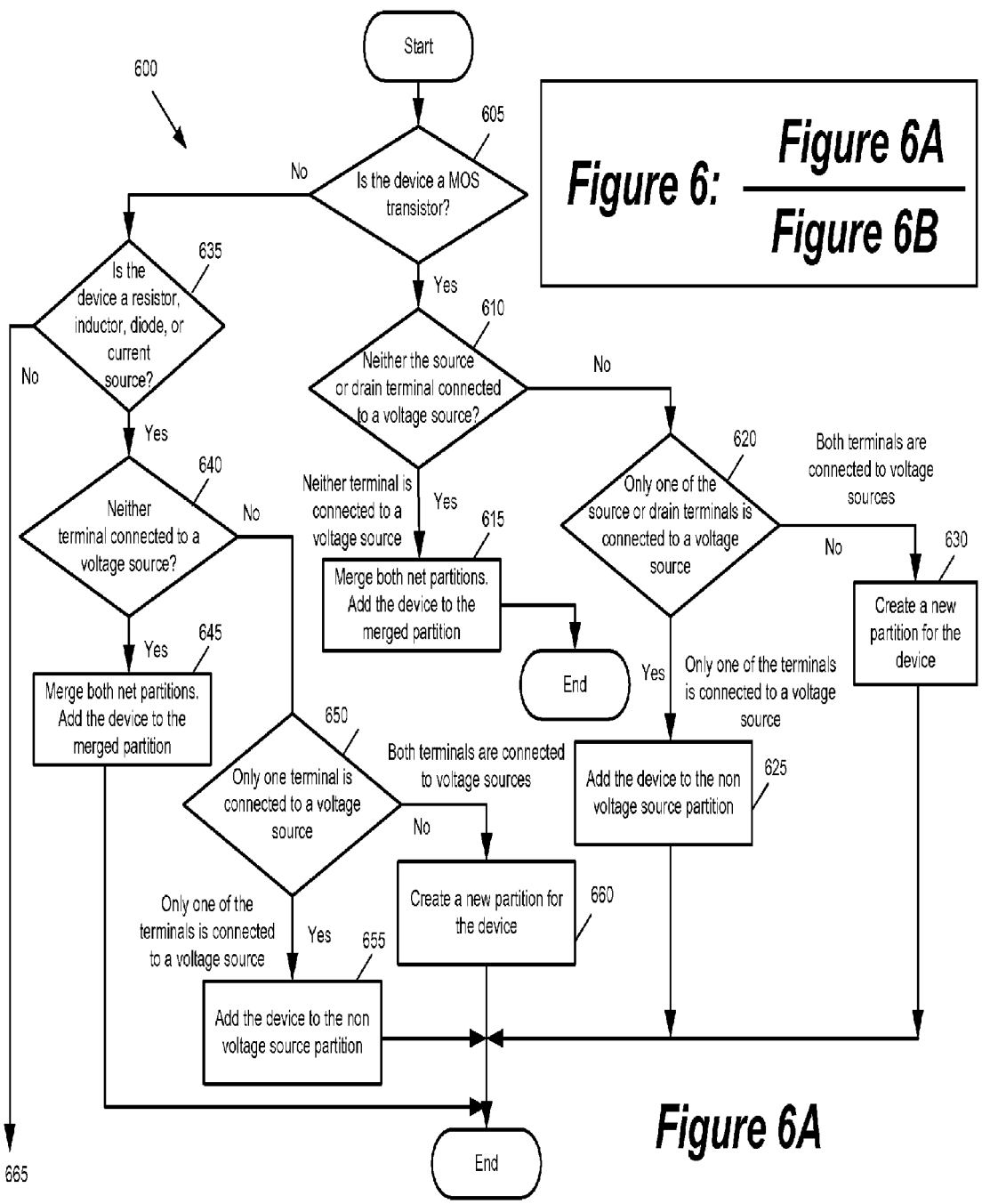

HIERARCHICAL PARTITIONING

CLAIM OF BENEFIT TO PRIOR APPLICATIONS

This application is a continuation application of an earlier filed U.S. Non-Provisional patent application Ser. No. 11/532,898, entitled "Hierarchical Partitioning", filed Sep. 18, 2006 now U.S. Pat. No. 7,555,733. U.S. Non-Provisional patent application Ser. No. 11/532,898 claims the benefit of U.S. Provisional Application 60/718,487, entitled "Hierarchical Partitioning" filed Sep. 18, 2005. The contents of U.S. patent application Ser. No. 11/532,898 and U.S. Provisional Application 60/718,487 are herein incorporated by reference.

FIELD OF THE INVENTION

The present invention is directed to circuit simulation. More particularly, the present invention is directed to partitioning of circuits for general-purpose simulation.

BACKGROUND OF THE INVENTION

General-purpose circuit simulators are powerful tools used in electrical circuit designs to verify circuit design and to simulate circuit behavior. For instance, in the integrated circuit (IC) design, the high costs of manufacturing an IC makes it very essential to verify the circuit behavior prior to manufacturing. Enormous cost savings are achieved by simulating different variations of a circuit's component values prior to manufacturing.

Circuit simulators such as Simulation Program with Integrated Circuits (SPICE) are widely used to verify electrical circuit design. These programs, however, simulate the entire circuit as a single matrix. Simulating the entire circuit requires a significant amount of processing time as the matrix becomes larger even though the matrices representing electrical circuits are very sparse. To reduce processing time, another group of simulators with less accurate but more efficient algorithms have been designed. These simulators, referred to as timing simulators, use simplified device models and equation formulation techniques. Many of these simulators compute circuit delays by simulating the response of the circuit to a given set of inputs.

In the past, timing simulators have flatly partitioned the entire circuit into small groups of transistors, so that they can solve a set of smaller matrices instead of one large matrix. Since the time necessary to solve a matrix grows super-linearly with respect to the number of rows and columns, solving several small matrices can be faster than solving a single large matrix. Also, partitioning the circuit allows the simulator to take advantage of latency and to employ multi-rate algorithms in solving the system equations. Flattening a circuit, however, can significantly increase memory consumption. As the size of modern IC and board level circuits grow, the impact of memory consumption becomes more significant. In addition, timing simulators are less accurate than simulators such as SPICE. Hence, there is a need in the art for a fast and highly-accurate simulator that achieves higher speed without significantly increasing memory consumption.

SUMMARY OF THE INVENTION

Some embodiments provide a method of simulating an electrical circuit. The method receives a circuit description that has a set of sub-circuits. The method defines several partitions for several sub-circuits. Each partition includes a set of devices and device terminals. The method then simulates the circuit using the partitioned sub-circuits. In some embodiments, the method ranks the sub-circuits prior to partitioning based on a parent-child relationship that shows how a sub-circuit is instantiated by other sub-circuits. These embodiments partition child sub-circuits first.

Some embodiments provide a method of partitioning an electrical circuit. The method receives a circuit description that includes a set of sub-circuit descriptions. The method identifies whether a sub-circuit is instantiated from other sub-circuits. For a particular sub-circuit that is instantiated from other sub-circuits, the method duplicates the particular sub-circuit into a first copy and a second copy when one port of the particular sub-circuit is connected to a voltage source in at least one instance and the same port is not connected to a voltage source in at least another instance. In some embodiments, the method references the first copy when the particular sub-circuit is instantiated by another sub-circuit in which the port is connected to a voltage source. The method references the second copy when the particular sub-circuit is instantiated by another sub-circuit in which the port is not connected to a voltage source.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, wellknown structures and devices are shown in block diagram form in order not to obscure the description of the invention with unnecessary detail.

I. Overview of the Circuit Simulator that Uses Hierarchical Partitioning

Some embodiments provide a method of simulating an electrical circuit. The method receives a circuit description that has a set of sub-circuits. The method defines several partitions for several sub-circuits. Each partition includes a set of devices and device terminals. The method then simulates the circuit using the partitioned sub-circuits. In some embodiments, the method ranks the sub-circuits prior to partitioning based on a parent-child relationship that shows how a sub-circuit is instantiated by other sub-circuits. These embodiments partition child sub-circuits first.

Some embodiments provide a method of partitioning an electrical circuit. The method receives a circuit description that includes a set of sub-circuit descriptions. The method identifies whether a sub-circuit is instantiated from other sub-circuits. For a particular sub-circuit that is instantiated from other sub-circuits, the method duplicates the particular sub-circuit into a first copy and a second copy when one port of the particular sub-circuit is connected to a voltage source in at least one instance and the same port is not connected to a voltage source in at least another instance. In some embodiments, the method references the first copy when the particular sub-circuit is instantiated by another sub-circuit in which the port is connected to a voltage source. The method references the second copy when the particular sub-circuit is instantiated by another sub-circuit in which the port is not connected to a voltage source.

Figure 1:
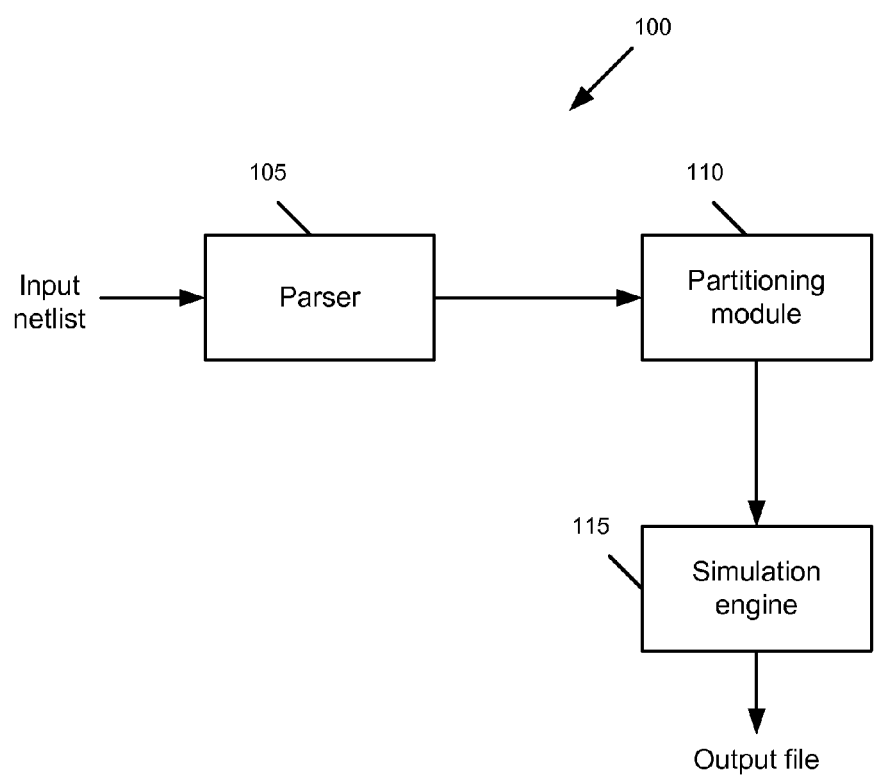
FIG. 1 illustrates a simplified block diagram of the circuit simulator of some embodiments.

FIG. 1 illustrates a simplified block diagram of a circuit simulator 100 of some embodiments. As shown, the simulator 100 includes a parser 105, a partitioning module 110, and a simulation engine 115. The parser 105 receives a description of the circuit elements and their connections as input. In some embodiments, this description is in a form of a text description called a netlist. The netlist defines the circuit as a set of one or more sub-circuits. The parser 110 parsers the netlist and converts it to an internal representation.

The partitioning module breaks the internal representation of the circuit into smaller partitions. Some embodiments hierarchically partition the circuit in way that each sub-circuit is individually partitioned. The simulation engine 115 simulates the electrical circuit using the partitioned internal representation of the circuit. The result is generated in the form of one or more output files.

Figure 2:
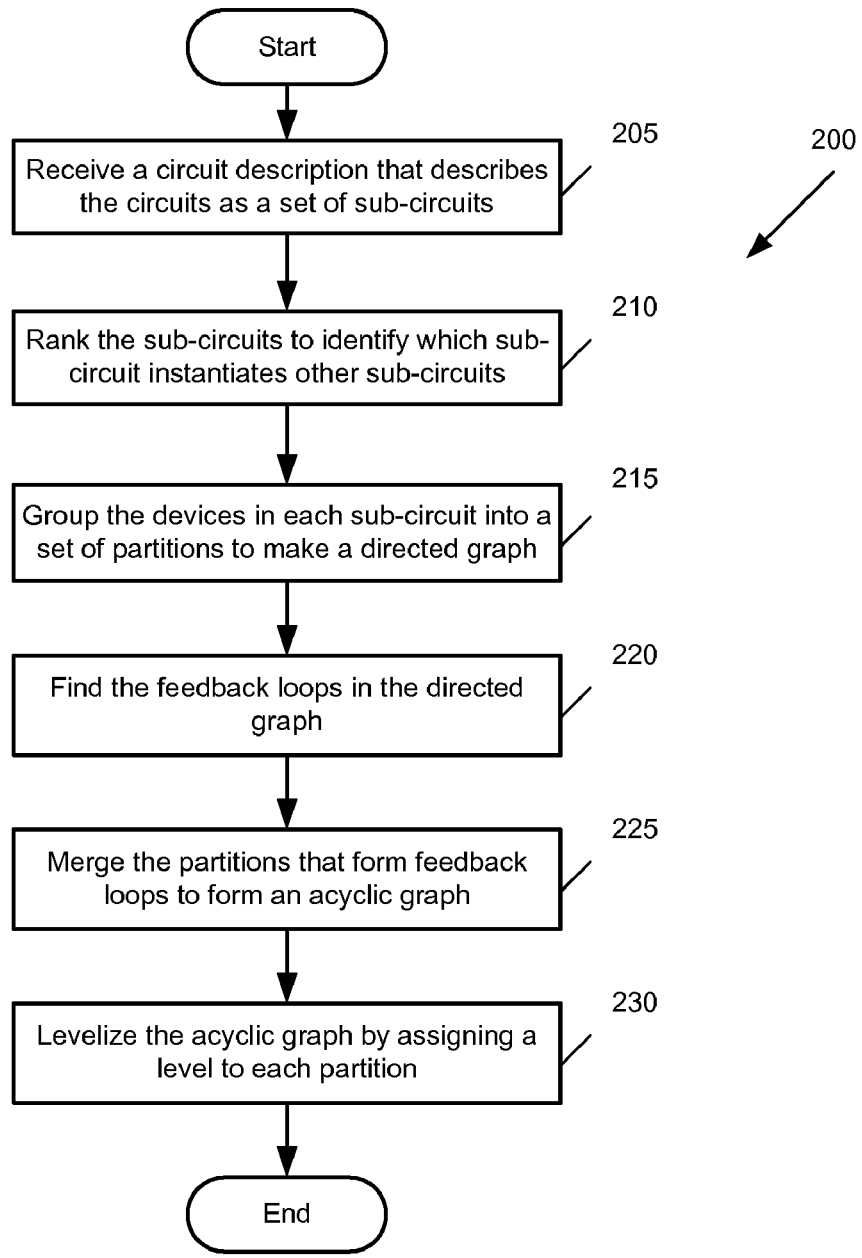
FIG. 2 conceptually illustrates a high level process that hierarchically partitions a circuit in some embodiments.

FIG. 2 conceptually illustrates a high level process that partitions a circuit hierarchically. As shown, the process receives (at 205) a circuit description that describes the circuits as a set of sub-circuits. Each sub-circuit can have several devices in it. Next, the process hierarchically partitions the circuit by performing the following operations. At 210, the process ranks the sub-circuits to identify which sub-circuit instantiates other sub-circuits. The sub-circuits form a parent-child relationship with the parent sub-circuits instantiating child sub-circuits. In some embodiments, the child sub-circuits are processed first. In these embodiments, the instances of the instantiated child sub-circuits can be readily partitioned within their parent sub-circuits.

At 215, the process groups the devices in each sub-circuit into a set of partitions to form a directed graph. Next, the process finds (at 220) the feedback loops within the directed graph. At 225, the process merges the partitions that form feedback loops to form an acyclic graph.

Finally, at 230, the process levelizes the acyclic graph by assigning a level to each partition. This level corresponds to the distance that the group of devices and their terminals in a partition have from the primary inputs to the circuit. This information is used by simulation engine 115 to facilitate simulation of the electrical circuit.

Several more detailed embodiments of the invention are described in sections below. Section II describes the overall flow of hierarchical partitioning in some embodiments. This discussion is followed by the discussion in Section III that describes further processing of the partitioned sub-circuits to remove the feedback loops among them and to identify the order by which the resulting partitions should be simulated by the simulation engine. Last, Section IV describes a computer system that implements some of the embodiments of the invention.

II. Hierarchical Partitioning

A. Overall Flow of Hierarchical Partitioning

Traditional timing simulators flatten the entire circuit before partitioning it into smaller blocks. In other words, traditional simulators treat the circuit as a whole and do not partition sub-circuits separately. The graph theory for circuit partitioning is discussed in V. Rao and T. Trick, "Network partitioning and ordering for MOS VLSI Circuits," IEEE Trans. Computer-Aided Design, vol. CAD-6, no 1, Jan. 1987; and V. Rao, D. Overhauser, I. Hajj, and T. Trick, "Switch-Level Timing Simulation of MOS VLSI circuits," Boston: Kluwer Academic Publishers, 1988. Both of these documents are incorporated herein by reference.

In order to keep the memory footprint small, some embodiments of the invention partition the circuit hierarchically. These embodiments partition the sub-circuits individually. Since a sub-circuit can only be connected through its ports, some embodiments only utilize information about the ports of a child sub-circuit to partition its instances in a parent sub-circuit. In other words, instances in a sub-circuit can be treated as a black box. Thus, only an abstract view of the sub-circuit is used when partitioning the sub-circuit's corresponding instance in its parents.

As an example of the information that is used about an instance in order to partition it, a MOS transistor can be considered as a four terminal device, or analogously as an instance of a sub-circuit with four ports. When none of the terminals are connected to a voltage source, the terminals form three partitions, namely, source and drain in one partition, and gate and bulk in two separate partitions. Hence, an instance can be thought of as an N-terminal device. An instance can be partitioned when it is known how the terminals are partitioned.

Figure 3:
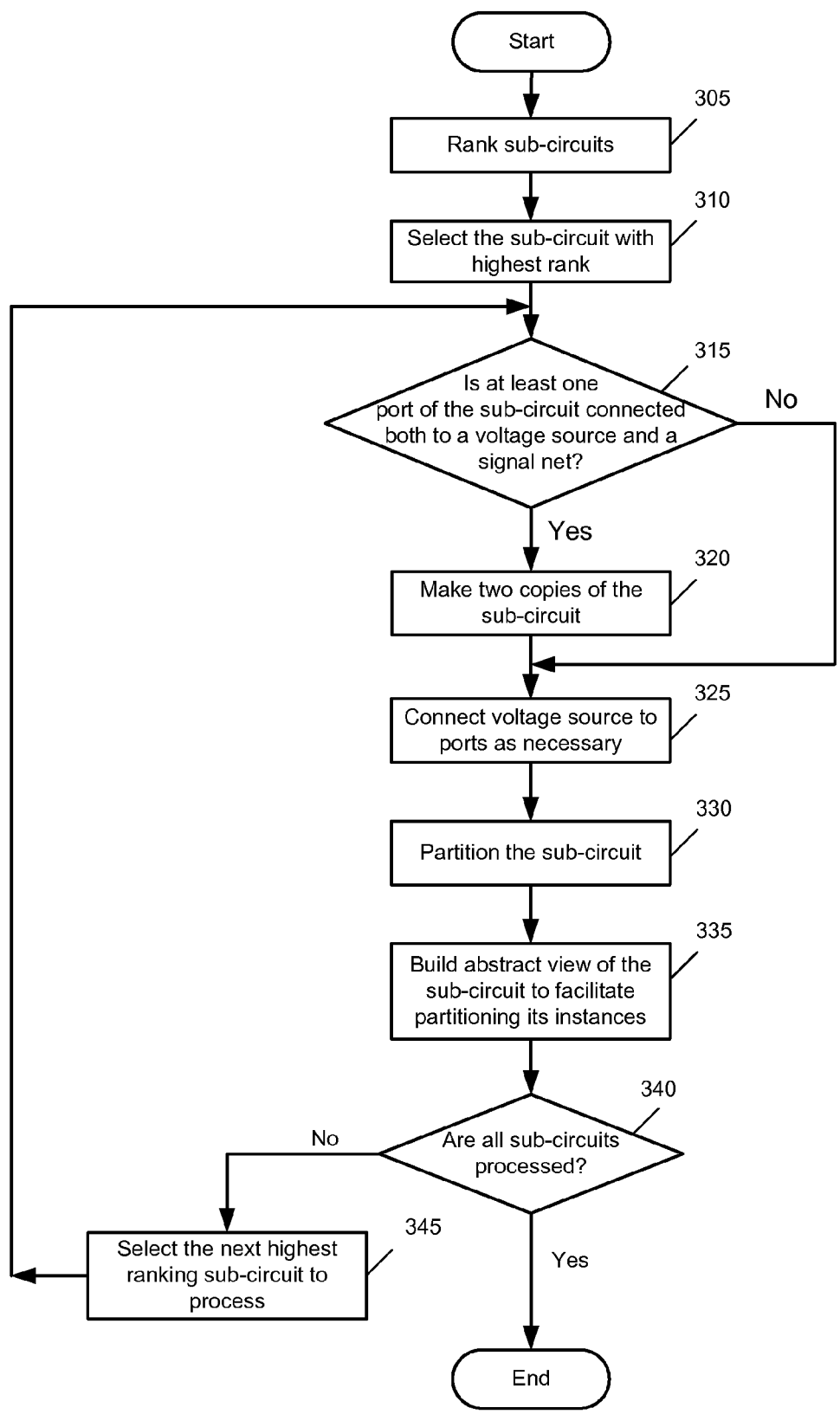
FIG. 3 illustrates a process that partitions a sub-circuit in some embodiments.

FIG. 3 illustrates a process 300 that hierarchically partitions a circuit in some embodiments. Some embodiments partition all the child sub-circuits first. This allows these embodiments to efficiently generate the abstract view of a sub-circuit. As shown, the process ranks (at 305) the sub-circuits such that child sub-circuits appear in the list before their parents. Some embodiments use a depth first search algorithm to determine the ranking. This algorithm is described in Sub-Section B below.

Next, the process selects (at 310) the sub-circuit with the highest rank (i.e., the sub-circuit that has no children). Since a sub-circuit can only be connected through its ports, some embodiments can partition a sub-circuit when the port properties are known. Those port properties are: (1) port is connected to a voltage source node, and (2) port is connected to a signal net. In other words, these embodiments have to determine whether a sub-circuit port is connected to a voltage source or not. At 315, the process determines whether any port in the sub-circuit is connected to both voltage source and signal nets. In other words, the process determines whether the sub-circuit has a port that is connected to a voltage source in some instances and is not connected to a voltage source in other instances.

If the process determines that no port in the sub-circuit is connected to both voltage source and signal nets, the process proceeds to 325 which is described below. Otherwise, to simplify the complexity of the process, the process makes (at 320) two copies of the sub-circuit. Assume that the two sub-circuits are now s1 and s2. Some embodiments have all instances of the original sub-circuit that have the port connected to a voltage source net reference sub-circuit s1 and all others reference sub-circuit s2. Therefore, the port in s1 is always connected to a voltage source net and the port in s2 is always connected to a signal net. Some embodiments make two copies of a sub-circuit for each one its ports that satisfies the criteria mentioned in operation 315 above.

At 325, the process connects voltage sources to ports as necessary. To partition a sub-circuit without any instances, some embodiments connect a fictitious DC voltage source to each port that has a DC path to ground. The other ports are left as is.

The process then partitions (at 330) the sub-circuit. Details of partitioning an individual sub-circuit are described in Sub-Section C below. Since child sub-circuits are partitioned before their parent sub-circuits, whenever a sub-circuit instantiates other sub-circuits, the instances of these instantiated child sub-circuits can be readily partitioned within their parent sub-circuits. These instances are treated as an N-terminal device, except that the instance itself will not be assigned to a partition, only its terminals. The rule for grouping devices that is described in Sub-Section C below would have one additional rule for an instance. Namely, for all the terminals in the same partition, group all the corresponding nets connected to those terminals, unless they are voltage source nets.

Next, the process builds (at 335) an abstract view of each sub-circuit to facilitate partitioning of its instances within parent sub-circuits. The port properties that are computed for the abstract view are: (1) a port is a voltage source node from within, (2) a port is strongly connected, (3) a port is capacitively connected, (4) two or more ports are partitioned together, (5) one or more ports are fan-out ports, and (6) the level between fan-out ports.

At 340, the process determines whether all sub-circuits are processed. If yes, the process exits. Otherwise, the process selects (at 345) the next highest ranking sub-circuits that is not partitioned yet and proceeds to 315 that was described above.

After the nets and devices have been grouped together, they can be represented as a directed graph. The nodes of this directed graph represent the nets and devices that have been grouped together. The edges of the directed graph represent the propagation of the signals through the circuit. The signal flow for MOS transistors is from the gate net partition to the source and drain net partitions. The signal flow for voltage source net partitions is from the voltage source net to the other partitions. The signal flow for coupling capacitors is from the coupling capacitor partition to the other partitions. This directed graph is further processed as described in Section III below to make it suitable for use by the simulation engine 115.

The rest of this section describes the details of several steps used during hierarchical partitioning described above. Sub-Section B describes ranking of individual sub-circuits prior to partitioning. Sub-Section C describes the details of how an individual sub-circuit is partitioned.

B. Ranking Sub-Circuits

Figure 4:
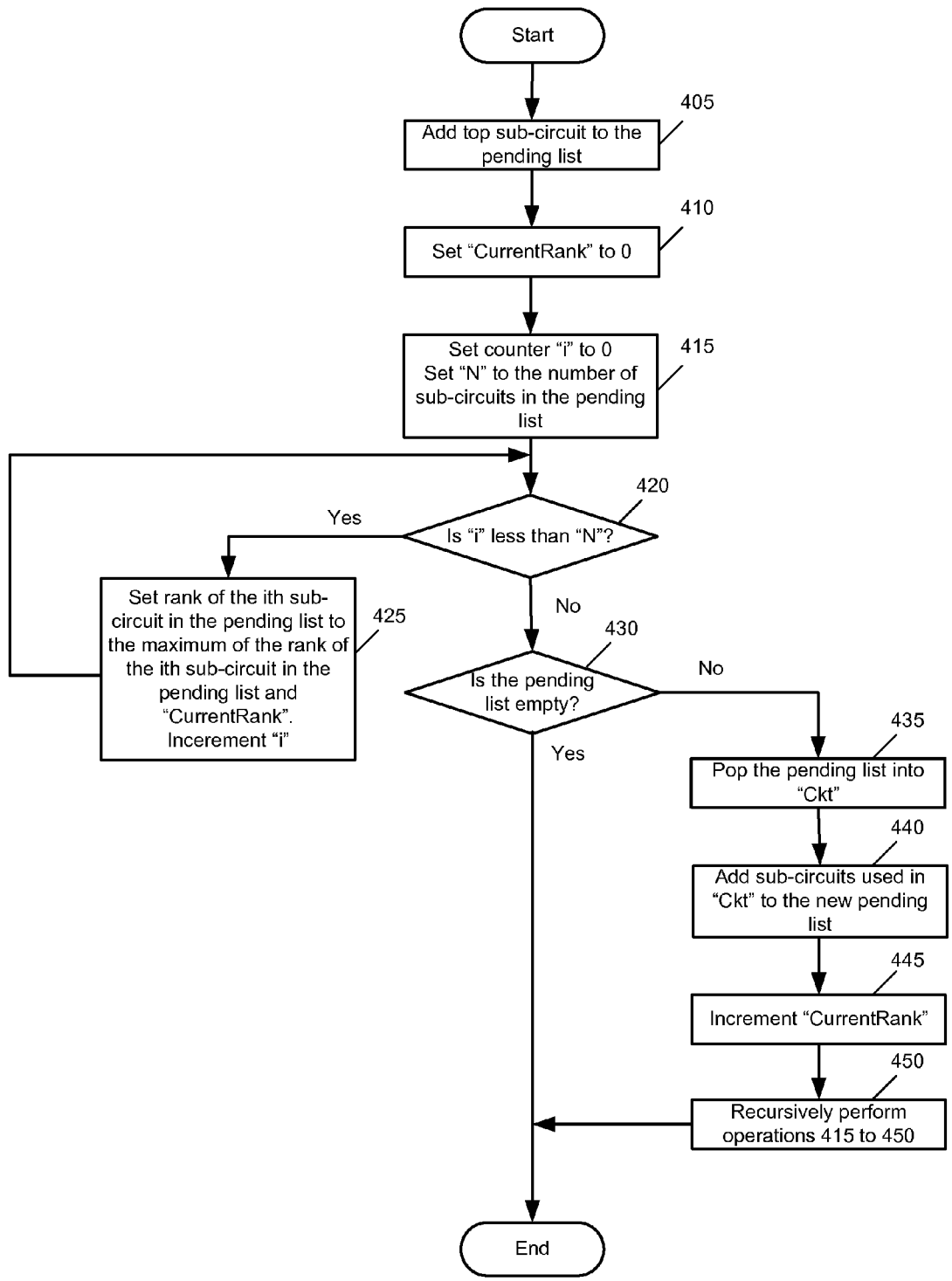
FIG. 4 illustrates a process that ranks sub-circuits in some embodiments.

FIG. 4 illustrates a process 400 that ranks the sub-circuits in some embodiments. This process determines which sub-circuit instantiates other sub-circuits. The highest ranking sub-circuits are the leaves of the graph that do not instantiate any other sub-circuits. As shown, the process adds (at 405) the top sub-circuit to a pending list. The top sub-circuit with all of its sub-circuit instances (and its instances' instances) represents the whole circuit. The process then sets (at 410) the value of "CurrentRank" to 0.

Next, the process sets (at 415) "N" to the number of sub-circuits in the pending list and sets the counter, "i", to 0. The process then determines (at 420) whether "i" is less than "N". If not, the process proceeds to 430 which is described below. Otherwise, the process sets the rank of the $i^{th}$ entry in the pending list to the maximum of the rank of the $i^{th}$ entry in the pending list and the value of "CurrentRank". Next, the process increments the value of "i". The process then proceeds to 420 which was described above.

At 430, the process determines whether the pending list is empty. If yes, the process exits. Otherwise, the process schedules the next set of sub-circuits to be ranked by appending those sub-circuits to the pending list. Let the first sub-circuit in the pending list be called "Ckt". The process pops (at 435) this sub-circuit from the pending list. The process then adds (at 440) sub-circuits used in "Ckt" to a new pending list. The process then increments (at 445) the value of "CurrentRank". The process then recursively performs (at 450) operations 420 to 450 for the new pending list.

Some embodiments partition a sub-circuit by grouping together the devices that are strongly connected. In these embodiments, devices that are coupled through channels or resistors are considered strongly connected while devices that are connected through capacitors are considered weakly connected.

Figure 5:
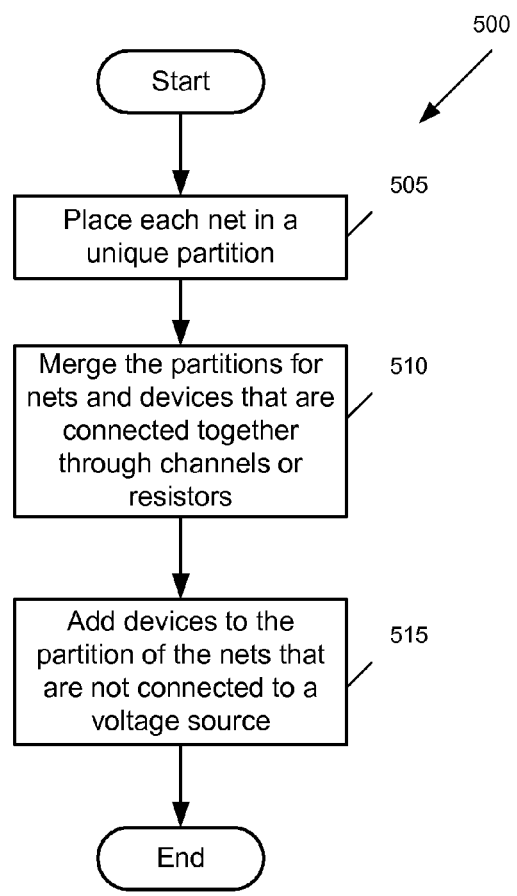
FIG. 5 illustrates a process that performs partitioning of a sub-circuit in some embodiments.

FIG. 5 illustrates a process 500 that performs partitioning of a sub-circuit in some embodiments. As shown, the process first places (at 505) each net in the sub-circuit in a unique partition. Next, the process merges (at 510) the partitions for the nets that are connected together through channels and resistors. Finally, the devices are added (at 515) to the partitions of the nets that are not connected to voltage sources (as described below, a MOS transistor is never added to the partition of its gate or bulk terminals). Each one of these operations is described in more detail below.

C. Grouping Devices of a Sub-Circuit Together

Figure 6B:
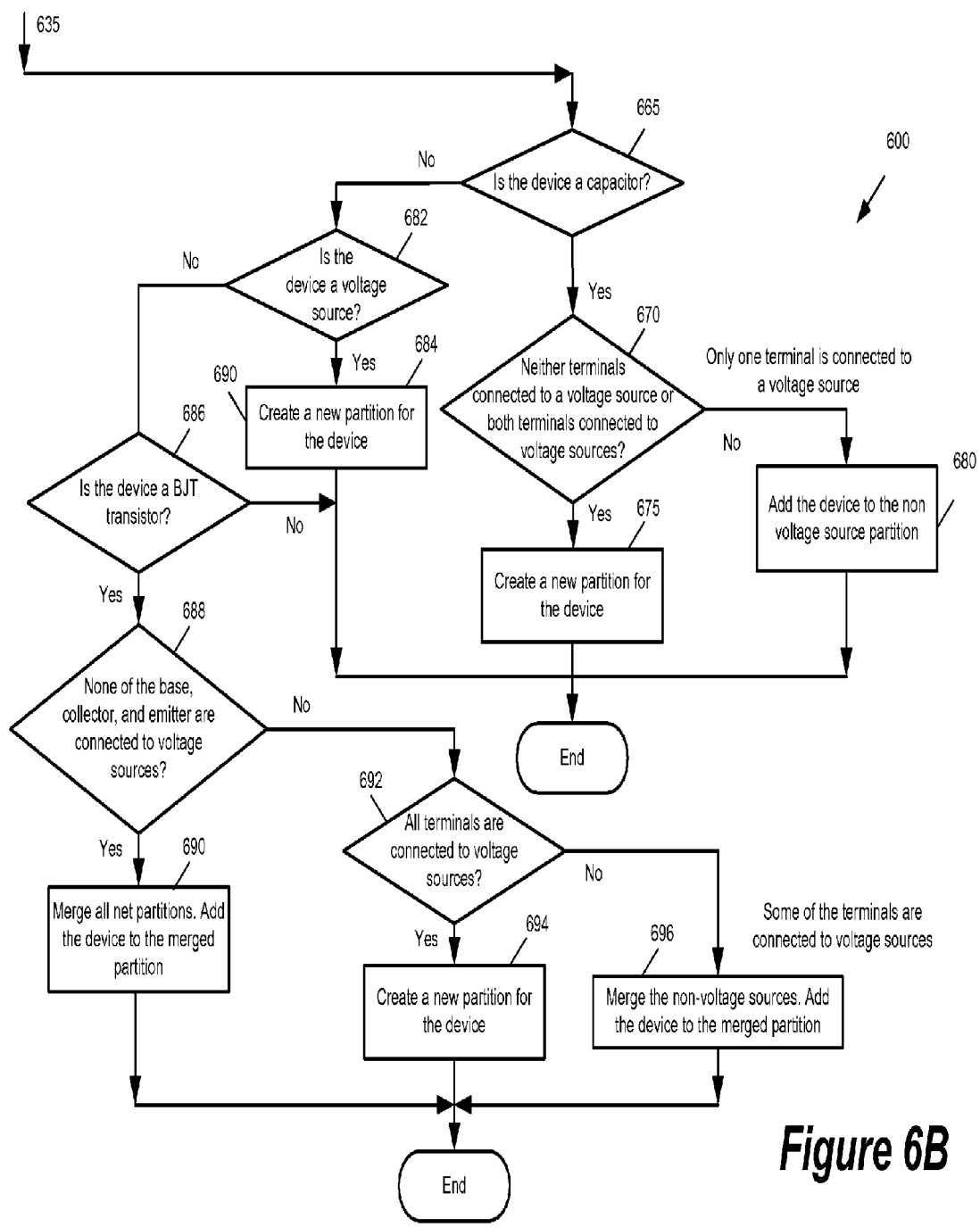
FIG. 6 illustrates a process that groups the devices in some embodiments.

FIG. 6 illustrates a process 600 that groups the devices in some embodiments. This process, referred to as channel-connected partitioning initially ensures that each net (a net is a terminal or a connection on a device) is in a unique partition. Nets connected to a DC voltage source form their own partitions (a voltage source net is any net that has a path to ground through voltage sources. This includes nets that are directly connected to ground). The process then examines each device by performing the following set of operations.

Figure 7:
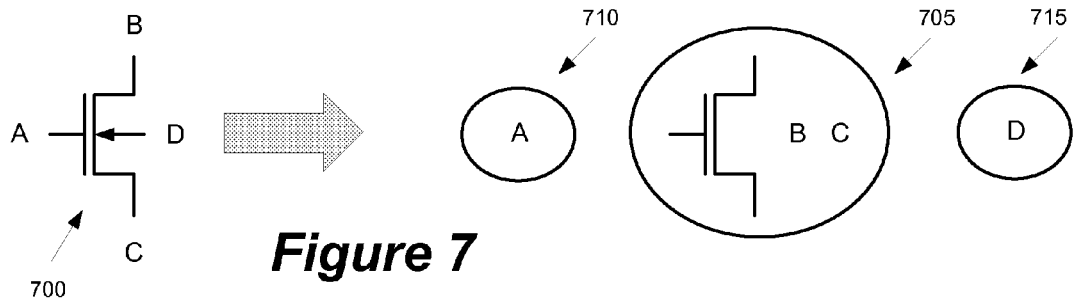
FIGS. 7-10 illustrate grouping terminals for a MOS transistor device in some embodiments.

The process determines (at 605) whether the device is a MOS transistor. If not, the process proceeds to 635 which is described below. Otherwise, the process determines whether neither the source terminal nor the drain terminal of the transistor is connected to a voltage source net. If at least one terminal is connected to a voltage source net, the process proceeds to 620 which is described below. Otherwise, the process merges (at 615) both net partitions and adds the device to the merged partition. The process then exits. This operation is illustrated in FIG. 7. Neither the source nor the drain terminal of MOS transistor 700 is connected to a voltage source net. As shown, process 600 merges the partitions of the two terminals, "B" and "C", and adds the device to the merged partition to create partition 705. The gate terminal, "A", and the bulk terminal, "D", remain in separate partition 710 and 715 respectively.

Figure 8:
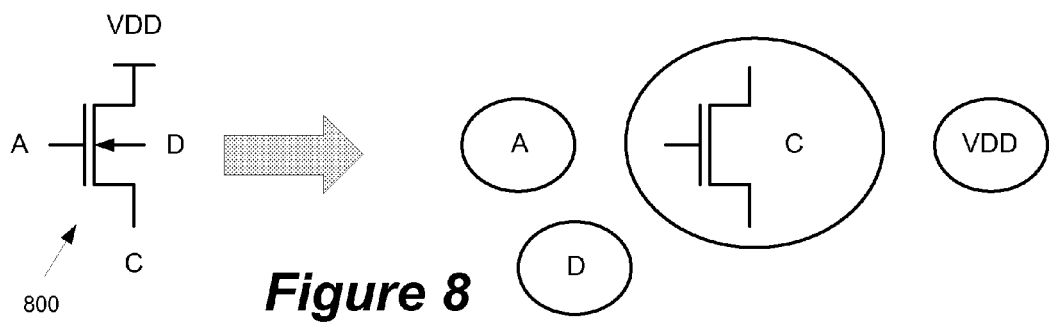
Figure 9:
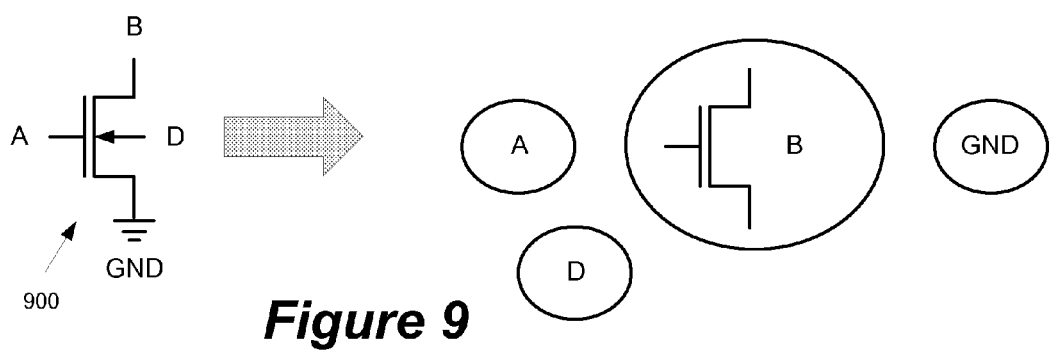

At 620, the process determines whether only one of the source or drain terminals is connected to a voltage source. If not, the process proceeds to 630 which is described below. Otherwise, the process adds (at 625) the device to the non voltage-source net partition. This operation is illustrated in FIG. 8. The source terminal of MOS transistor 805 is connected to a voltage source, VDD. As shown, process 600 adds the device to the partition of the drain net, "C" which is not connected to the voltage source. The voltage source, the gate terminal, and the bulk terminal remain in separate partitions. Similarly, FIG. 9 illustrates a MOS transistor 900 which its drain terminal connected to ground. As shown, process 600 adds the device to the partition of the source net, "B", which is not connected to ground. The gate terminal, the bulk terminal, and ground remain in separate partitions.

Figure 10:
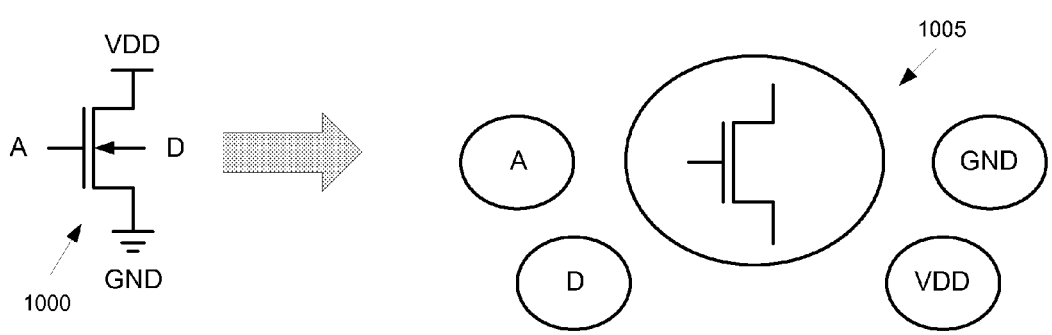

When the process determines (at 620) that both terminals are connected to voltage sources, the process creates (at 630) a new partition for the device. The process then exits. This operation is illustrated in FIG. 10. The source terminal of MOS transistor 1000 is connected to a voltage source, VDD and the drain terminal is connected to ground. As shown, process 600 creates a new partition 1005 for the device. The gate terminal, the bulk terminal, the voltage source, and ground remain in separate partitions.

Figure 11:
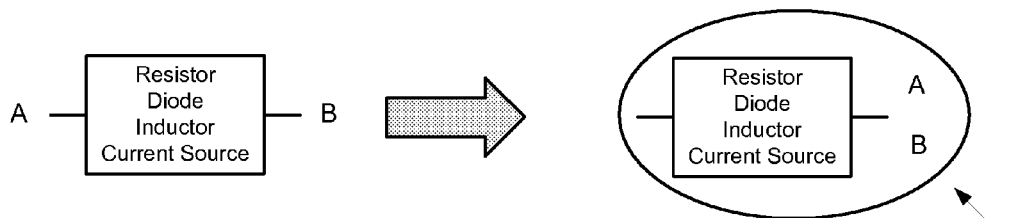
FIGS. 11-14 illustrate grouping terminals for resistor, diode, inductor, and current source devices in some embodiments.

When the process determines (at 605) that the device is not a MOS transistor, the process determines (at 635) whether the device is a resistor, inductor, diode, or current source. If not, the process proceeds to 665 which is described below. Otherwise, the process determines (at 640) whether neither terminal is connected to a voltage source. If at least one terminal is connected to a voltage source, the process proceeds to 650 which is described below. Otherwise, the process merges both net partitions and adds the device to the merged partition. The process then exits. This operation is illustrated in FIG. 11. Neither terminals of device 1100 (which can be a resistor, diode, inductor, or current source) is connected to a voltage source. As shown, process 600 merges both net partitions and adds the device to the merged partition 1105.

Figure 12:
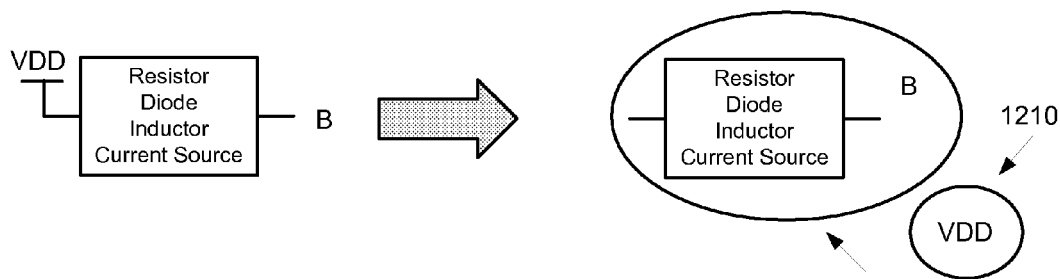
Figure 13:
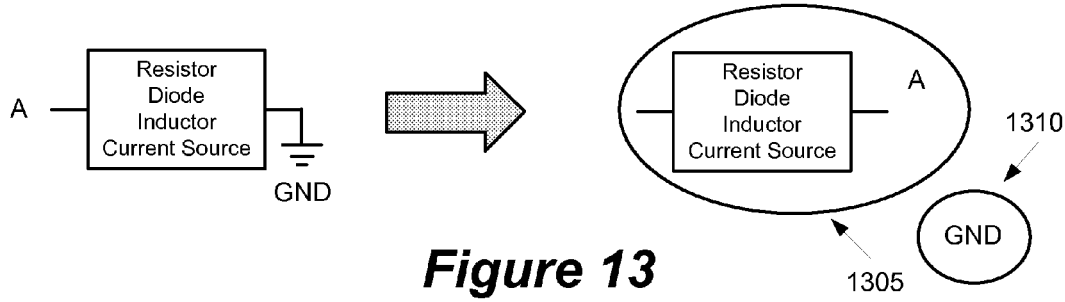

At 650, the process determines whether only one terminal is connected to a voltage source. If not, the process proceeds to 660 which is described below. Otherwise, the process adds the device to the non-voltage source net partition. This operation is illustrated in FIG. 12. As shown, one of the terminals is connected to a voltage source, VDD. Process 600 adds the device to the non-voltage source net partition 1205. The voltage source remains in a separate partition 1205. Similarly, FIG. 13 illustrates a device with one of its terminals connected to ground. Process 600 adds the device to the non voltage-source net partition 1305. The ground net remains in a separate partition 1310.

Figure 14:
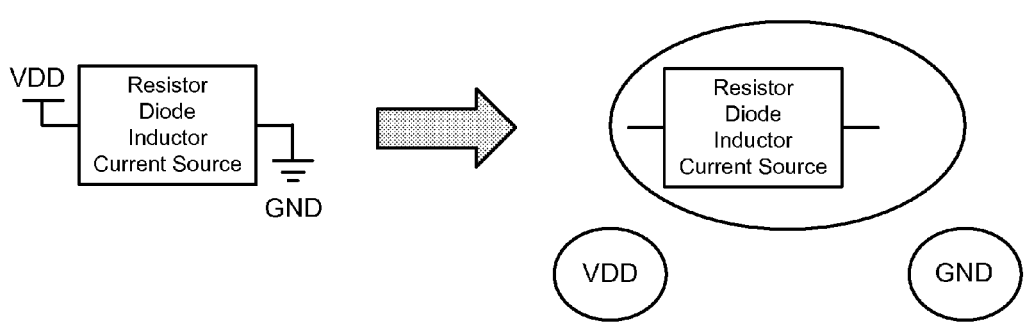

When the process determines (at 650) that both terminals are connected to voltage sources, the process creates (at 660) a new partition for the device. The process then exits. This operation is illustrated in FIG. 14. As shown, the two terminals of the device are connected to a voltage source, VDD, and ground. Process 600 creates a new partition 1405 for the device. The voltage source and ground remain in separate partitions.

Figure 15:
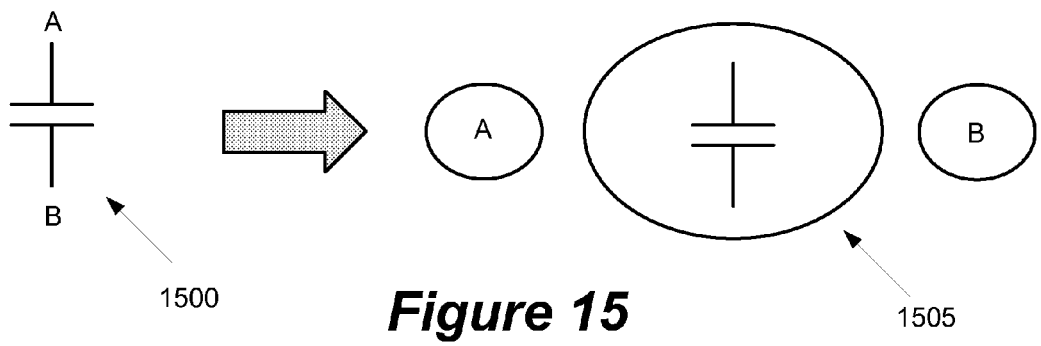
FIGS. 15-18 illustrate grouping terminals for a capacitor device in some embodiments.
Figure 16:
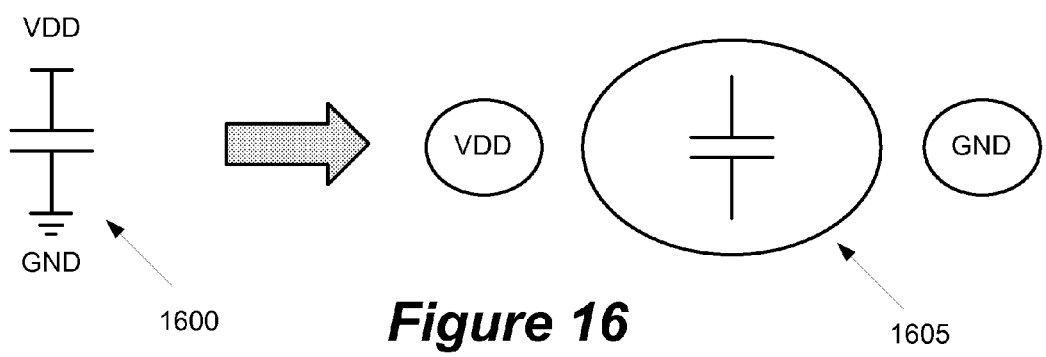

When the process determines (at 635) that the device is not a resistor, inductor, diode, or current source, the process determines (at 665) whether the device is a capacitor. If not, the process proceeds to 682 which is described below. Otherwise, the process determines (at 670) whether none of the terminals are connected to a voltage source net or both terminals are connected to voltage sources. If only one terminal is connected to a voltage source, the process proceeds to 680 which is described below. Otherwise, the process creates (at 675) a new partition for the device. The process then exits. This operation is illustrated in FIG. 15. As shown, none of the terminals of capacitor 1500 is connected to a voltage source. Process 600 creates a new partition 1505 for the device. Similarly, FIG. 16 illustrates a capacitor 1600 which one terminal connected to a voltage source, VDD, and the other terminal connected to ground. Process 600 creates a new partition 1600 for the device.

Figure 17:
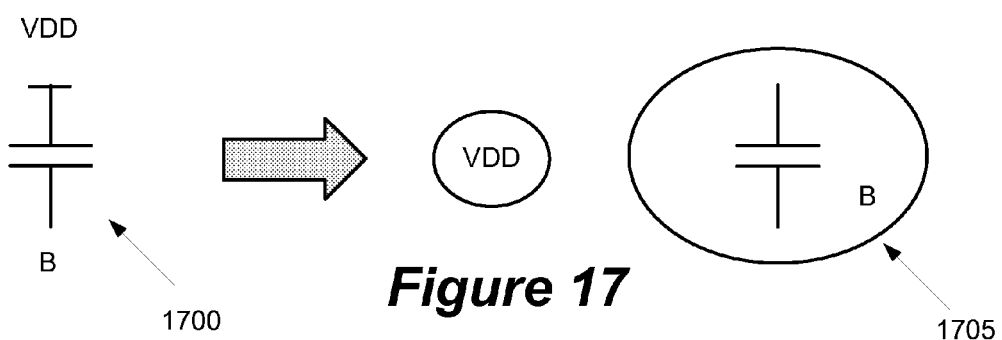
Figure 18:
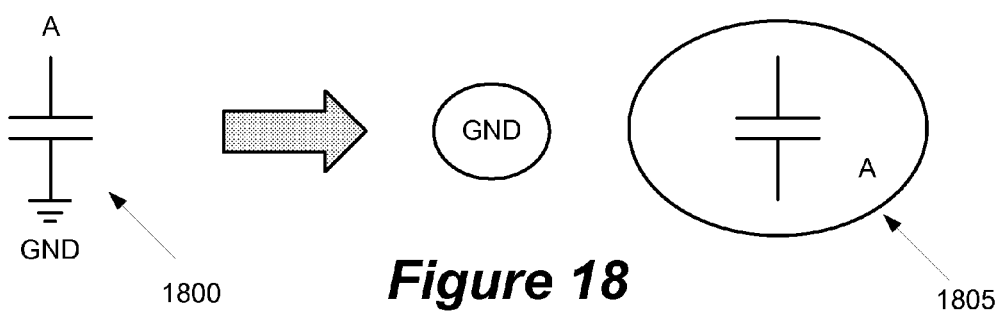

When the process determines (at 670) that only one terminal is connected to a voltage source, the process adds (at 660) the device to the non voltage-source net partition. The process then exits. This operation is illustrated in FIG. 17. As shown, one of the terminals of capacitor 1700 is connected to a voltage source, VDD. Process 600 adds the device to the non voltage-source net partition 1705. Similarly, FIG. 18 illustrates a capacitor 1800 with one of its terminals connected to ground. Process 600 adds the device to the non voltage-source net partition 1805.

When the process determines (at 665) that the device is not a capacitor, the process determines (at 682) whether the device is a voltage source. If yes, the process creates a new partition for the device. The process then exits. Otherwise, the process determines (at 686) whether the device is a BJT transistor. If not, the process exits. Otherwise, the process determines whether none of the base, collector, and emitter terminals are connected to a voltage source. If not, the process proceeds to 692 which is described below.

Figure 19:
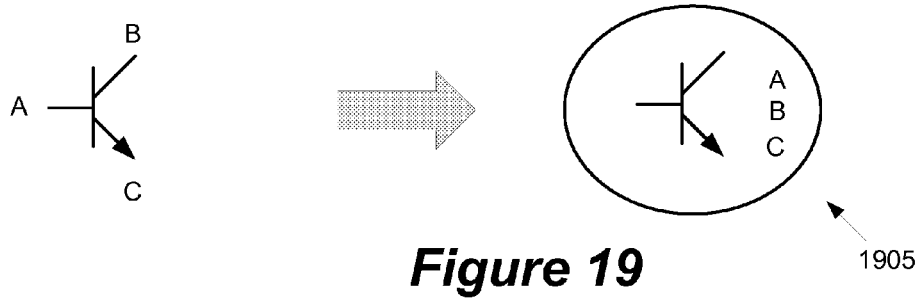
FIGS. 19-21 illustrate grouping terminals for a BJT transistor in some embodiments.

Otherwise, the process merges (at 690) all net partitions and adds the device to the merged partition. The process then exits. This operation is illustrated in FIG. 19. As shown, process 600 merges all net partitions and adds the device to the merged partition 1905.

Figure 20:
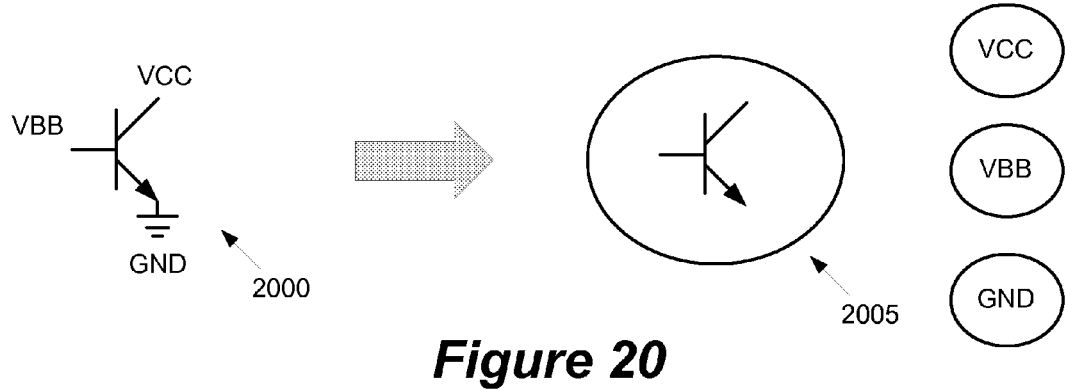

At 692, the process determines whether all terminals are connected to voltage sources. If not, the process proceeds to 696 which is described below. Otherwise, the process creates a new partition for the device. The process then exits. This operation is illustrated in FIG. 20. As shown all terminals of transistor 2000 are connected to voltage sources. Process 600 creates a new partition 2005 for the device. All terminals remain in separate partitions.

Figure 21:
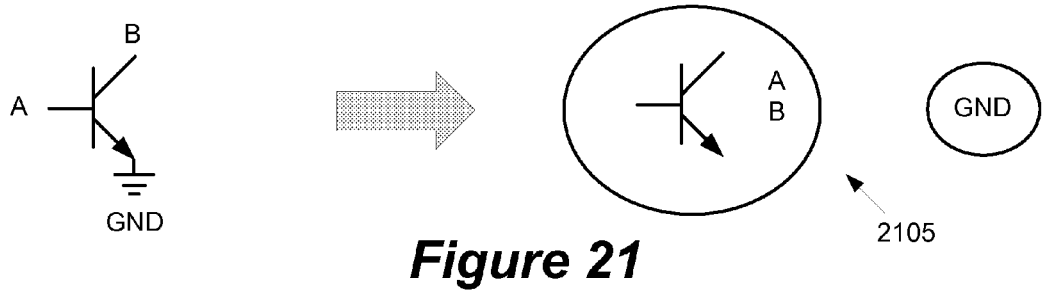

When the process determines (at 692) that some (but not all) terminals are connected to voltage sources, the process merges (at 696) the non voltage-source nets. The process then adds the device to the merged partition. The process then exits. This operation is illustrated in FIG. 21. As shown, one of the terminals is connected to ground. Process 600 merges the non voltage-source net partitions and adds the device to the merged partition 2105.

III. Further Processing of the Directed Graph After Individual Sub-Circuits are Partitioned After the directed graph is generated using the process described in Section II above, the directed graph is further processed to remove its feedback loops and to identify the order in which the partitions should be simulated by the simulation engine 115.

A. Finding Feedback Loops

Next, the feedback loops of the directed graph are identified. Feedback loops are the set of nodes and edges, such that for two nodes w and v, there is a path from w to v and a path from v to w. To find the feedback loops, some embodiments determine the fan-out relationship of the instance terminals. Each instance terminal corresponds to a sub-circuit port. This port belongs to a partition. Port P2 is a fan-out of Port P1, if there exists a path from the partition containing port P1 to the partition containing Port P2. This can be computed once, after the sub-circuit is partitioned.

Some embodiments then apply Tarjan's algorithm to find feedback loops in a sub-circuit. Tarjan's Algorithm (described in R. Tarjan, "Depth-first search and linear graph algorithms," SIAM J. Comput., vol. 1, no. 2, pp. 146-160, June 1972) is an efficient method for finding the loops in the directed graph. Tarjan's Algorithm is described in R. Tarjan, "Depth-first search and linear graph algorithms," SIAM J. Comput., vol. 1, no. 2, pp. 146-160, June 1972. This paper is incorporated herein by reference.

Figure 22:
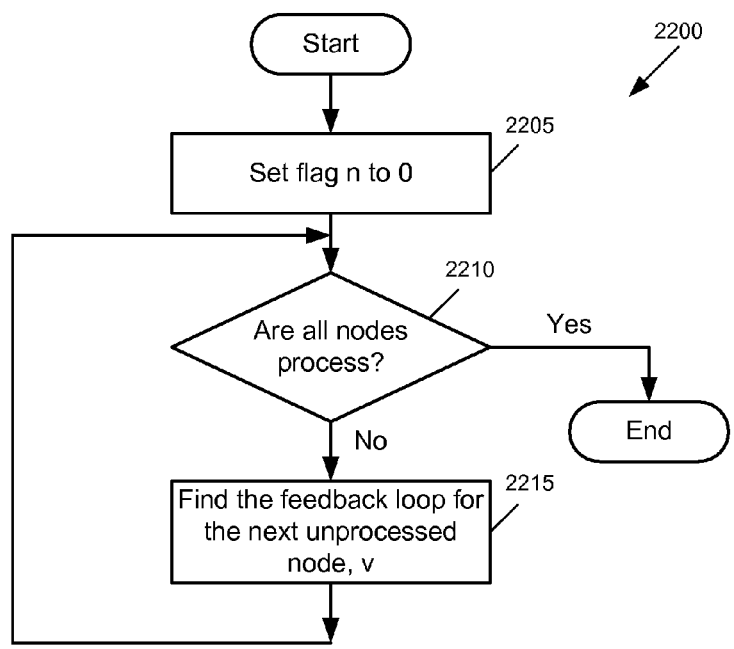
FIG. 22 conceptually illustrates a process that finds all feedback loops in a sub-circuit in some embodiments.

FIG. 22 illustrates a process 2200 that processes a graph to identify its feedback loops. The process initially sets (at 2205) a flag, n, to 0. This flag has two purposes. The first purpose is to assign a unique loop identifier to each node while the graph is processed. The second purpose is to uniquely identify the order the node has been processed. Next, the process determines (at 2210) whether all nodes of the graph are processed. If yes, the process exits. Otherwise, the process finds (at 2215) the feedback loop for the next unprocessed node, v. Finding the feedback loop for a node is described in FIG. 23.

Figure 23:
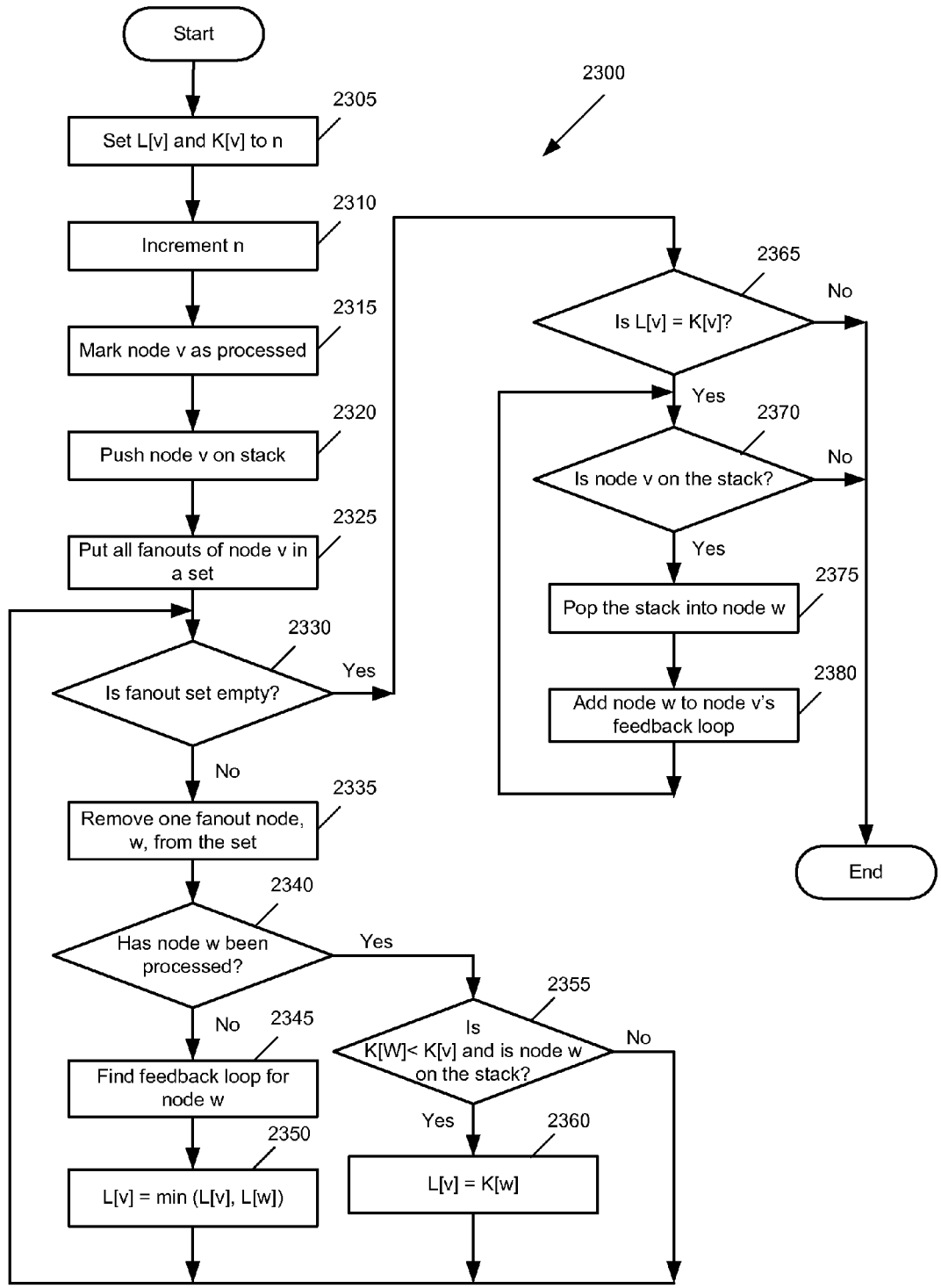
FIG. 23 conceptually illustrates a process that finds the feedback loops containing a node in some embodiments.

FIG. 23 illustrates a process 2300 that determines if a node (i.e., a partition) is in a feedback loop. As shown, initially the loop identifier, "L", of node v is set to n. Also, node processing order, "K", is set to n. The node processing order, "K", is used by process 2300 to determine if there is a feedback loop for node v. It also allows the process to efficiently determine all the nodes that belong to the same feedback loop.

Next, the process increments (at 2310) the value of n. Next the process marks (at 2315) node v as processed. The process then pushes (at 2320) node v into a stack. The process then puts (at 2325) all fan-out nodes of node v into a set. Next, the process determines (at 2330) whether the fan-out set is empty. If yes, the process proceeds to 2365 which is described below. Otherwise, the process removes one of the fan-out nodes, w, from the set.

Next, the process determines (at 2340) whether node w has been processed. If yes, the process proceeds to 2355 which is described below. Otherwise, the process recursively finds (at 2345) feedback loops that contain node w. The process then sets (at 2350) the loop identifier of node v (L[v]) to the minimum of the current loop identifier of node v and the loop identifier of node w. If node v and node w are in different loops, this step effectively merges both loops into a single loop containing both node v and node w. The process then proceeds to 2330 which was described above.

When the process determines (at 2340) that node w has been already processed, the process determines (at 2355) whether K[w] is less than K[v] and whether node w is on the stack. If not, the process proceeds to 2330 which was described above. Otherwise, the process sets the level of node v (L[v]) to K[w].

When the process determines (at 2330) that the fan-out set of node v is empty (i.e., all fan-out nodes are already processed), the process determines (at 2365) whether the level of node v (L[v]) is equal to K[v]. If not, the process exits. Otherwise, the process determines (at 2370) whether node v is on the stack. If not, the process exits. Otherwise, the process pops (at 2375) the stack into node w. Next, the process adds node w to node v's feedback loop. The process then proceeds to 2365 which was described above.

B. Removing Feedback Loops

After the feedback loops have been determined, some embodiments merge the nodes that form feedback loops to form an acyclic graph. This acyclic graph is suitable for the simulation engine 115 to process. A simple depth first search algorithm is then used (as described below) to determine the levels of each node in the acyclic graph.

C. Levelizing Node and Device Groups

Determining the levels of each node in the acyclic graph identifies the order in which the partitions should be simulated by the simulation engine 115. The nodes in the acyclic graph can then be assigned a level representing the depth of the node in the graph. This corresponds to the distance that the group of nets and devices are from the primary inputs to the circuit. Nodes that have no fan-ins are assigned level 0. These nodes are the partitions that represent the primary inputs. The level of a node is one more than the maximum level of all of its fan-ins.

Figure 24:
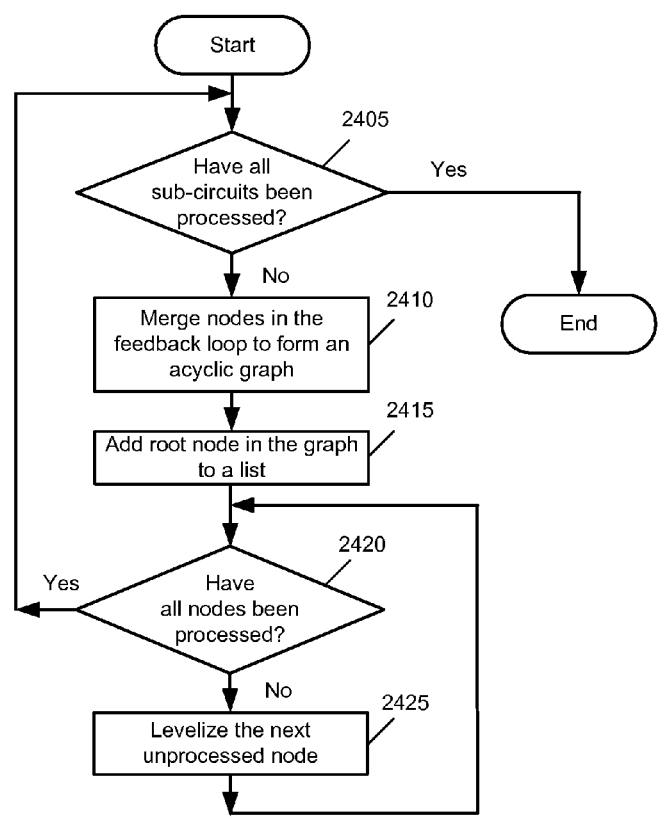
FIG. 24 illustrates a process that levelizes nodes of all sub-circuits in some embodiments.

Some embodiments also use levelization of the circuit hierarchically. Computing a level for a node informs the simulator the order in which a partition should be processed. While in a flat circuit each node can be thought of as having a weight of one, in the hierarchical case, the instance terminals can have a weight greater than one. Specifically, the weight of each instance terminal is equal to the level of all its children. FIG. 24 illustrates a process 2400 that levelizes a circuit in some embodiments. As shown, the process determines (at 2405) whether all sub-circuits are processed. If yes, the process exits. Otherwise, the process merges (at 2410) nodes in the same feedback loop to form an acyclic graph.

Next, the process adds (at 2415) the root node in the graph to a list. The root node represents the entire feedback group in the graph. The process then determines whether all nodes in the list are processed. If yes, the process proceeds to 2405 which was described above. Otherwise, the process levelizes the next unprocessed node as described in conjunction with FIG. 25 below. The process then proceeds to 2420 which was described above.

Figure 25:
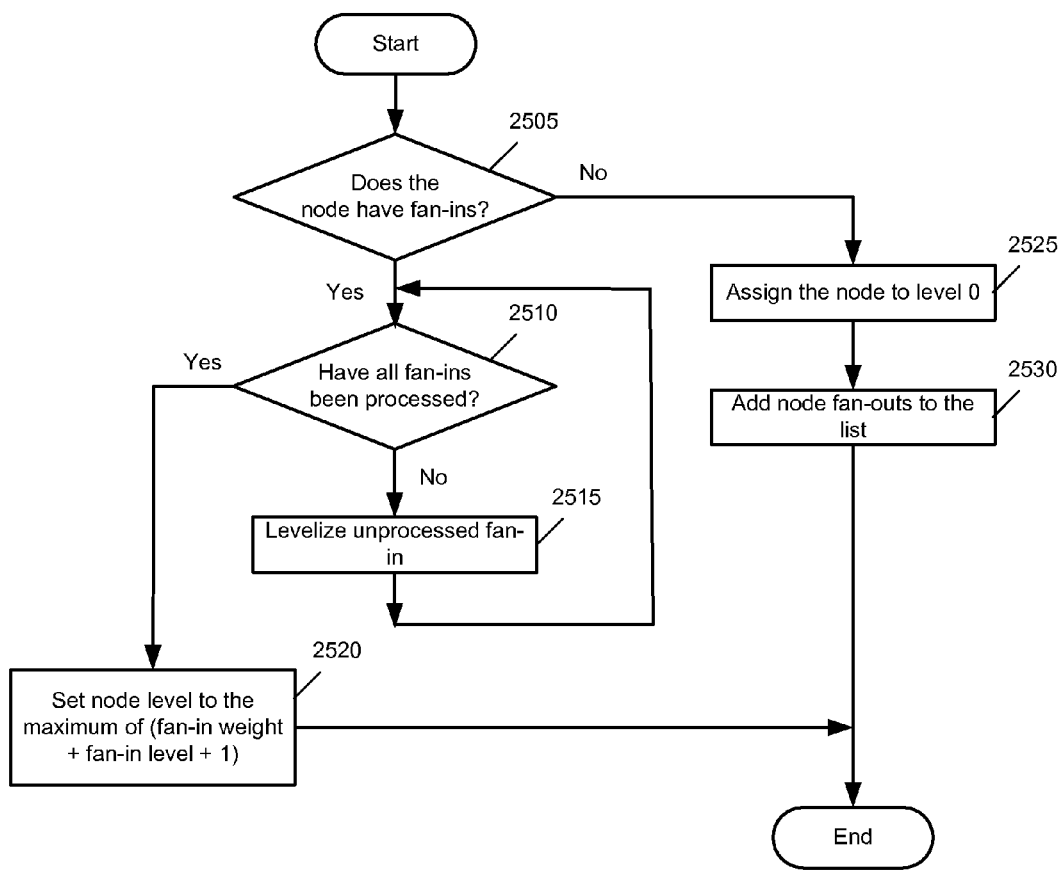
FIG. 25 illustrates a process that levelizes a node in some embodiments.

FIG. 25 illustrates a process 2500 that levelizes a node in some embodiments. As shown, the process determines (at 2505) whether the node has any fan-in nodes. If no, the process proceeds to 2525 which is described below. Otherwise, the process determines (at 2510) whether all fan-in nodes have been processed. If yes, the process proceeds to 2520 which is described below. Otherwise, the process recursively levelizes the unprocessed fan-in. The process then proceeds to 2510 which was described above.

At 2520, the process calculates the value of "fan-in weight+fan-in level+1" for each fan-in of the node and sets the node level to the maximum of these computed values. The fan-in level is an indication of how deep a partition is embedded within other sub-circuits. The fan-in weight is the effective level of the node. After 2520, the process exits.

When the process determines (at 2505) that the node does not have fan-ins, the process assigns (at 2525) the node to level 0. The process then adds (at 2530) the node fan-outs to the list. The process then exits.

IV. Computer System

Figure 26:
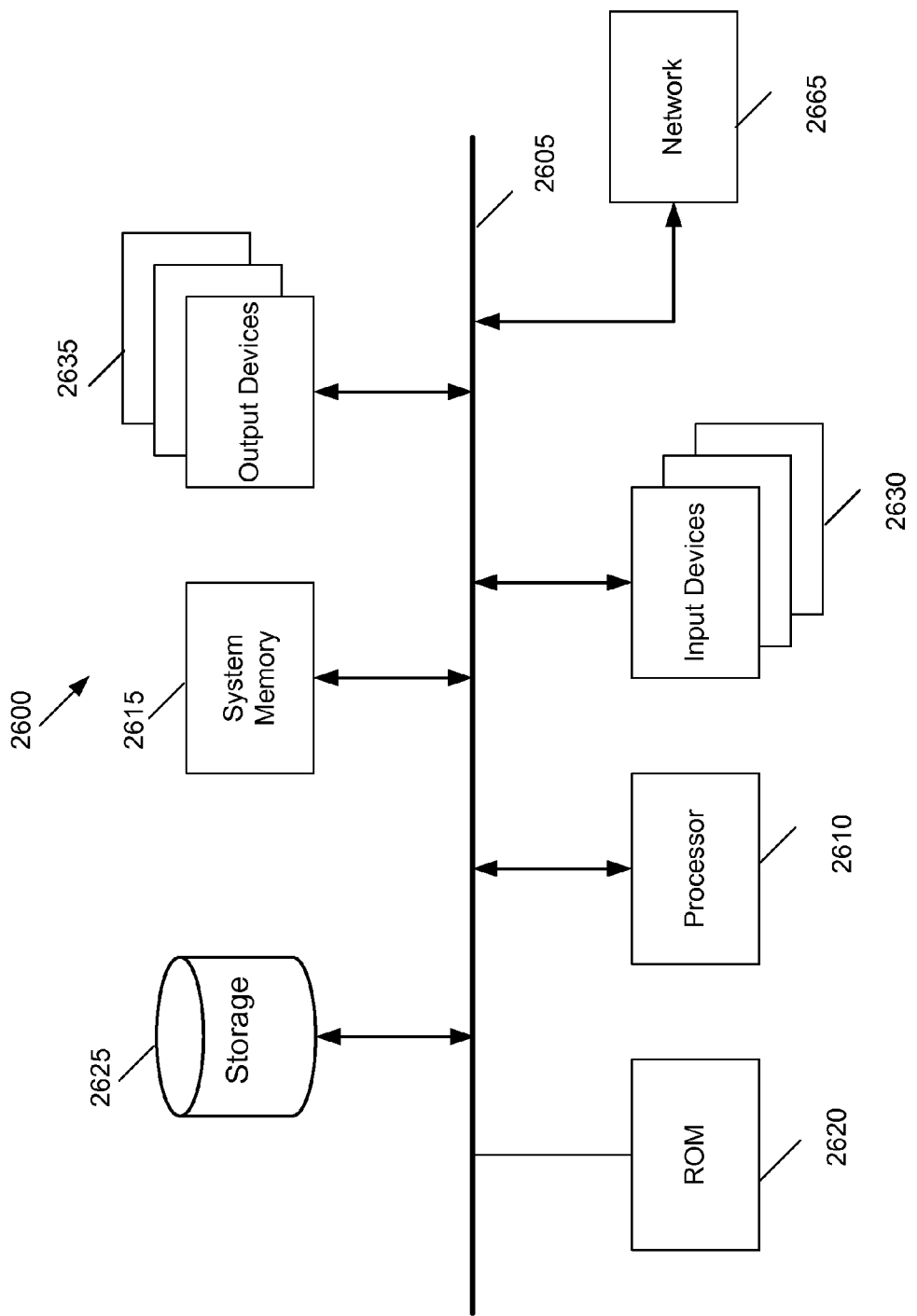
FIG. 26 conceptually illustrates a computer system with which some embodiments are implemented.

FIG. 26 conceptually illustrates a computer system with which some embodiments of the invention are implemented. The computer system 2600 includes a bus 2605, a processor 2610, a system memory 2615, a read-only memory 2620, a permanent storage device 2625, input devices 2630, and output devices 2635.

The bus 2605 collectively represents all system, peripheral, and chipset buses that support communication among internal devices of the computer system 2600. For instance, the bus 2605 communicatively connects the processor 2610 with the read-only memory 2620, the system memory 2615, and the permanent storage device 2625.

From these various memory units, the processor 2610 retrieves instructions to execute and data to process in order to execute the processes of the invention. The read-only-memory (ROM) 2620 stores static data and instructions that are needed by the processor 2610 and other modules of the computer system. The permanent storage device 2625, on the other hand, is a read-and-write memory device. This device is a non-volatile memory unit that stores instruction and data even when the computer system 2600 is off. Some embodiments of the invention use a mass-storage device (such as a magnetic or optical disk and its corresponding disk drive) as the permanent storage device 2625. Other embodiments use a removable storage device (such as a floppy disk or zip® Disk, and its corresponding disk drive) as the permanent storage device.

Like the permanent storage device 2625, the system memory 2615 is a read-and-write memory device. However, unlike storage device 2625, the system memory is a volatile read-and-write memory, such as a random access memory. The system memory stores some of the instructions and data that the processor needs at runtime.

Instructions and/or data needed to perform processes of some embodiments are stored in the system memory 2615, the permanent storage device 2625, the read-only memory 2620, or any combination of the three. For example, the various memory units may contain instructions for processing multimedia items in accordance with some embodiments. From these various memory units, the processor 2610 retrieves instructions to execute and data to process in order to execute the processes of some embodiments.

The bus 2605 also connects to the input and output devices 2630 and 2635. The input devices enable the user to communicate information and select commands to the computer system. The input devices 2630 include alphanumeric keyboards and cursor-controllers. The output devices 2635 display images generated by the computer system. For instance, these devices display IC design layouts. The output devices include printers and display devices, such as cathode ray tubes (CRT) or liquid crystal displays (LCD).

Finally, as shown in FIG. 26, bus 2605 also couples computer 2600 to a network 2665 through a network adapter (not shown). In this manner, the computer can be a part of a network of computers (such as a local area network ("LAN"), a wide area network ("WAN"), or an Intranet) or a network of networks (such as the Internet). Any or all of the components of computer system 2600 may be used in conjunction with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. In other places, various changes may be made, and equivalents may be substituted for elements described without departing from the true scope of the present invention. Thus, one of ordinary skill in the art would understand that the invention is not limited by the foregoing illustrative details, but rather is to be defined by the appended claims.

We claim:

1. A computer-implemented method for simulating an electrical circuit comprising a set of sub-circuits, each sub-circuit comprising a set of ports, the method comprising:
    receiving a circuit description comprising a set of sub-circuit descriptions;
    defining, based on said circuit description, a hierarchical relationship among the set of sub-circuits that specifies whether each sub-circuit is instantiated by other sub-circuits;
    identifying a particular sub-circuit having a particular port that (i) connects, in a first instantiated instance, to a voltage source and (ii) does not connect, in a second instantiated instance, to any voltage source;
    creating (i) a first copy of said particular sub-circuit for simulating the particular sub-circuit when the particular port is connected to a voltage source in the first instantiated instance and (ii) a second copy of said particular sub-circuit for simulating the particular sub-circuit when the particular port is not connected to a voltage source in the second instantiated instance; and
    at the computer, performing a simulation of the circuit using the first and second copies of the particular sub-circuit.

2. The method of claim 1, wherein defining the hierarchical relationship comprises:
    ranking the sub-circuits based on a parent-child relationship, wherein each parent sub-circuit instantiates one or more child sub-circuits; and
    defining a plurality of partitions for the sub-circuits, wherein partitions for child sub-circuits are defined prior to partitions for parent sub-circuits.

3. The method of claim 2, wherein each sub-circuit comprises a set of devices, wherein defining the plurality of partitions comprises:
    for all device nets in a particular partition, grouping said nets unless said nets are voltage source nets, wherein a net is a connection on a device.

4. The method of claim 3, wherein defining the plurality of partitions further comprises grouping devices of a sub-circuit together in the plurality of partitions.

5. The method of claim 2, wherein defining the plurality of partitions comprises:
    identifying partitions that form feedback loops in each sub-circuit; and
    merging said identified partitions.

6. The method of claim 2, wherein each sub-circuit comprises a set of devices, wherein defining the plurality of partitions comprises:
    for each sub-circuit, iteratively:
        placing each net in a separate partition, wherein a net is a connection to a port;
        merging the partitions for nets that are connected by a particular type of device; and
        adding each particular device to a particular partition.

7. The method of claim 2, wherein performing the simulation further comprises:
    using the defined partitions to perform the simulation of the circuit; and
    storing the results of said simulation.

8. The method of claim 2, wherein defining the plurality of partitions comprises defining different sets of partitions for different instances of a sub-circuit, wherein a first set of partitions is defined for the first instance of the particular sub-circuit and a second set of partitions is defined for the second instance of the particular sub-circuit, wherein the first and second sets have different numbers of partitions.

9. The method of claim 1, wherein performing the simulation of the circuit comprises:
    referencing the first copy of the particular sub-circuit when the particular sub-circuit is instantiated by a sub-circuit in which said particular port is connected to a voltage source; and
    referencing the second copy of the particular sub-circuit when the particular sub-circuit is instantiated by a sub-circuit in which said particular port is not connected to a voltage source.

10. The method of claim 1, wherein a port is one of an input and an output of a sub-circuit.

11. A non-transitory computer readable medium storing a computer program for simulating an electrical circuit comprising a set of sub-circuits, each sub-circuit comprising a set of ports, the computer program executable by a processor, said computer program comprising sets of instructions for:
   receiving a circuit description comprising a set of sub-circuit descriptions;
   defining, based on said circuit description, a hierarchical relationship among the set of sub-circuits that specifies whether each sub-circuit is instantiated by other sub-circuits;
   identifying a particular sub-circuit having a particular port that (i) connects, in a first instantiated instance, to a voltage source and (ii) does not connect, in a second instantiated instance, to any voltage source;
   creating (i) a first copy of said particular sub-circuit for simulating the particular sub-circuit when the particular port is connected to a voltage source in the first instantiated instance and (ii) a second copy of said particular sub-circuit for particular simulating the particular sub-circuit when the particular port is not connected to a voltage source in the second instantiated instance; and
   performing a simulation of the circuit using the first and second copies of the particular sub-circuit.

12. The non-transitory computer readable medium of claim 11, wherein said computer program further comprises sets of instructions for:
   ranking the sub-circuits based on a parent-child relationship, wherein each parent sub-circuit instantiates one or more child sub-circuits; and
   defining a plurality of partitions for the sub-circuits, wherein partitions for child sub-circuits are defined prior to partitions for parent sub-circuits.

13. The non-transitory computer readable medium of claim 12, wherein each sub-circuit comprises a set of devices, wherein said computer program further comprises a set of instructions for grouping all device nets in a particular partition unless said nets are voltage source nets, wherein a net is a connection on a device.

14. The non-transitory computer readable medium of claim 12, wherein said computer program further comprises sets of instructions for:
   identifying partitions that form feedback loops in each sub-circuit; and
   merging said identified partitions.

15. The non-transitory computer readable medium of claim 14, wherein each sub-circuit comprises at least one port, wherein the computer program further comprises sets of instructions for:
   computing a set of port properties for each sub-circuit; and
   building an abstract view of each particular sub-circuit based on the set of port properties computed for the particular sub-circuit.

16. The non-transitory computer readable medium of claim 12, wherein the set of instructions for performing the simulation comprises sets of instructions for:
   using the defined partitions to perform the simulation of the circuit; and
   storing the results of said simulation.

17. The non-transitory computer readable medium of claim 12, wherein the set of instructions for defining the plurality of partitions comprises a set of instructions for defining different sets of partitions for different instances of a sub-circuit, wherein a first set of partitions is defined for the first instance of the particular sub-circuit and a second set of partitions is defined for the second instance of the particular sub-circuit, wherein the first and second sets have different numbers of partitions.

18. The non-transitory computer readable medium of claim 11, wherein the set of instructions for performing the simulation of the circuit comprises sets of instructions for:
   referencing the first copy of the particular sub-circuit when the particular sub-circuit is instantiated by a sub-circuit in which said particular port is connected to a voltage source; and
   referencing the second copy of the particular sub-circuit when the particular sub-circuit is instantiated by a sub-circuit in which said particular port is not connected to a voltage source.

19. A non-transitory computer readable medium storing a computer program for simulating an electrical circuit comprising a set of sub-circuits, the computer program executable by at least one processor, said computer program comprising sets of instructions for:
   receiving a circuit description, said circuit description defining a hierarchical relationship among the set of sub-circuits that specifies whether a sub-circuit is instantiated by other sub-circuits;
   ranking the sub-circuits based on a parent-child relationship, wherein each parent sub-circuit instantiates one or more child sub-circuits; and
   performing a simulation of the circuit based on the ranking of the sub-circuits.

20. The non-transitory computer readable medium of claim 19, wherein said computer program further comprises sets of instructions for:
   duplicating a particular sub-circuit that is instantiated by other sub-circuits into a first copy when a particular port of the particular sub-circuit is connected to a voltage source in at least a first instantiated instance; and
   duplicating the particular sub-circuit into a second copy when the particular port is not connected to a voltage source in at least a second instantiated instance.

21. The non-transitory computer readable medium of claim 20, wherein the set of instructions for performing the simulation comprises sets of instructions for:
   referencing the first copy when the particular sub-circuit is instantiated by another sub-circuit in which said particular port is connected to a voltage source; and
   referencing the second copy when the particular sub-circuit is instantiated by another sub-circuit in which said particular port is not connected to a voltage source.

22. The non-transitory computer readable medium of claim 19, wherein the computer program further comprises a set of instructions for defining a plurality of partitions for the sub-circuits, wherein partitions for child sub-circuits are defined before partitions for parent sub-circuits.

23. The non-transitory computer readable medium of claim 22, wherein the set of instructions for performing the simulation comprises a set of instructions for using the defined partitions to simulate the circuit.

* * * * *